US007385462B1

(12) United States Patent
Epp et al.

(10) Patent No.: US 7,385,462 B1
(45) Date of Patent: Jun. 10, 2008

(54) WIDEBAND RADIAL POWER COMBINER/DIVIDER FED BY A MODE TRANSDUCER

(75) Inventors: Larry W. Epp, Pasadena, CA (US); Daniel J. Hoppe, La Canada, CA (US); Daniel Kelley, Hinkley, CA (US); Abdur R. Khan, La Crescenta, CA (US)

(73) Assignee: The United States of America as represented by the Administrator of the National Aeronautics and Space Administration, Washington, DC (US)

( * ) Notice: Subject to any disclaimer, the term of this patent is extended or adjusted under 35 U.S.C. 154(b) by 178 days.

(21) Appl. No.: 11/376,638

(22) Filed: Mar. 14, 2006

Related U.S. Application Data

(60) Provisional application No. 60/663,330, filed on Mar. 18, 2005.

(51) Int. Cl.
*H03H 7/38* (2006.01)
*H01P 5/12* (2006.01)

(52) U.S. Cl. ............................ 333/125; 333/26; 333/33; 333/136

(58) Field of Classification Search ................... 330/53, 330/56, 286, 295; 333/33, 26, 123–125, 333/127, 128, 136
See application file for complete search history.

(56) References Cited

U.S. PATENT DOCUMENTS 3,582,813 A * 6/1971 Hines .......................... 331/56
4,590,446 A * 5/1986 Hsu et al. ................... 333/125
4,598,254 A * 7/1986 Saito et al. .................. 330/286
4,684,874 A * 8/1987 Swift et al. ................. 333/125
4,812,782 A * 3/1989 Ajioka ....................... 330/286
5,392,008 A * 2/1995 Wong ........................ 333/21 R
6,242,984 B1 * 6/2001 Stones et al. ................ 330/295
2005/0174194 A1 8/2005 Wu et al.

OTHER PUBLICATIONS

Saad et al, "Analysis and Design of a Circular TE01 Mode Transducer" Microwave, Optics and Acoustics, Jan. 1977.
Chen, "A 19-Way Isolated Power Divider Via the TE01 Circular Waveguide Mode Transition," IEEE MTT-S, 1986.

* cited by examiner

*Primary Examiner*—Robert J. Pascal
*Assistant Examiner*—Kimberly E Glenn
(74) *Attorney, Agent, or Firm*—Mark Homer

(57) ABSTRACT

A radial power combiner/divider capable of a higher order (for example, N=24) of power combining/dividing and a 15% bandwidth (31 to 36 GHz). The radial power combiner/divider generally comprises an axially-oriented mode transducer coupled to a radial base. The mode transducer transduces circular TE01 waveguide into rectangular TE10 waveguide, and the unique radial base combines/divides a plurality of peripheral rectangular waveguide ports into a single circular TE01 waveguide end of the transducer. The radial base incorporates full-height waveguides that are stepped down to reduced-height waveguides to form a stepped-impedance configuration, thereby reducing the height of the waveguides inside the base and increasing the order N of combining/dividing. The reduced-height waveguides in the base converge radially to a matching post at the bottom center of the radial base which matches the reduced height rectangular waveguides into the circular waveguide that feeds the mode transducer.

13 Claims, 9 Drawing Sheets

(all dimensions shown in mils, e.g., inches x 1000)

(all dimensions in inches)

(all dimensions in inches)

(all dimensions in inches)

KEY RESULTS:
MATCH < -24DB OVER BAND
BANDWIDTH >>REQUIRED 10%

WIDEBAND RADIAL POWER COMBINER/DIVIDER FED BY A MODE TRANSDUCER

CROSS-REFERENCE TO RELATED APPLICATIONS

The present application derives priority from U.S. Provisional Application No. 60/663,330 filed 18 Mar. 2005.

STATEMENT OF GOVERNMENT INTEREST

The invention described hereunder was made in the performance of work under a NASA contract, and is subject to the provisions of Public Law #96-517 (35 U.S.C. 202) in which the Contractor has elected not to retain title.

BACKGROUND a. Field of invention

The invention relates to radial power divider/combiners and, in particular, to radial power divider/combiners that are suitable for use in solid-state power-amplifier (SSPA) devices.

b. Background of the invention

Solid State Power Amplifiers (SSPAs) are used in a variety of applications ranging from satellites, radar, and other RF applications requiring high output power. Typical SSPAs can achieve signal output levels of more than 10 watts using solid-state amplifiers such as Monolithic Microwave Integrated Circuits (MMICs), or individual tube amplifiers.

A fundamental problem with conventional SSPA technology is that individual MMICs produce less power and operate at lower efficiency compared to the individual tube devices. At Ka-band, for example, currently available MMIC chips have output power capability that is approximately an order of magnitude less compared to the Traveling Wave Tube Amplifier (TWTA). The efficiency is approximately half.

Although a single MMIC amplifier chip cannot achieve the requisite level of output power without excessive size and power consumption issues, MMIC technology is far more practical than tubes in space and other applications. MMIC technology offers a reduction in supply voltage, potential reduction in cost, improvement in linearity and reliability.

Consequently, efforts have been made to combine the outputs of several individual MMIC amplifiers to achieve the desired total transmitter output, and it has been found that a combination of a large number of MMICs is attractive for applications where these advantages outweigh the lost efficiency. Consequently, existing SSPA designs using MMIC chips typically use a radial splitting and combining architecture in which a signal is divided into a number of individual components. Each individual signal component is amplified by a respective amplifier, and the outputs of the amplifiers are combined into a single output that achieves the desired overall signal amplification.

However, to meet the output power requirements of space telecommunication systems, it is necessary to power combine a large number of individual MMICs in the SSPA, and yet this must be done in a highly efficient manner.

Existing power-combiners such as the in-phase Wilkinson combiner or the 90-degree branch-line hybrid combine a number of binary combiners in a cascaded manner, but this architecture becomes very lossy and cumbersome when the number of combined amplifiers becomes large. For example, to combine eight amplifiers using a conventional, binary microstrip branch-line hybrid at Ka-band (about 26.5 GHz), the combiner microstrip trace tends to be about six inches long and its loss tends to exceed 3 dB. A 3 dB insertion loss infers that half of the RF power output is lost, and this is unacceptable for most applications.

To overcome these loss and size problems, other approaches including the stripline radial combiner, oversized coaxial waveguide combiner, and quasi-optical combiner, have been investigated. The stripline radial combiner, using multi-section impedance transformers and isolation resistors, still suffers excessive loss at Ka-band, mainly because of the extremely thin substrate (<10 mil) required at Ka-band. The coaxial waveguide approach uses oversized coaxial cable, which introduces moding problems and, consequently, is useful only at low frequencies. The quasi-optical combiner uses hard waveguide feed horns at both the input and output to split and combine the power, and these are very large and cumbersome.

United States Patent Application 20050174194 by Wu, You-Sun et al. published Aug. 11, 2005 shows an N-Way Radial Power Divider/Combiner in which an input signal is provided to a transmission antenna that propagates into a divider. Within the divider, the input signal is divided into a plurality N of individual signals by waveguides disposed in a radial configuration around the transmitting antenna such that at least a portion of the input signal radiated by the antenna enters an input end of each waveguide. The individual signals are received by receiving antennas and provided to respective amplifiers. The amplifiers amplify the respective individual signals by a desired amplification factor. The amplified individual signals are provided to a plurality of transmitting antennas within the combiner. Inside the combiner, the amplified individual signals are combined to form an output signal that is received by a receiving antenna in the combiner. Though a ten-way divider/combiner is shown, N is said to be in the range of two to 100. The overall insertion loss of the 10-way power divider-combiner was measured using input signals from 20 to 30 GHz, and at 26.5 GHz, the loss for the combiner alone is 0.71 dB at 26.5 GHz.

It would be desirable to adapt a radial power-combiner architecture similar to the foregoing for a higher frequency bandwidth to power combine a larger number of amplifiers with better efficiency, using a smaller combining circuit that has minimum power loss. This is herein achieved by increasing the number of combining ports using reduced height waveguides in the radial base. The radial base has reduced-height waveguides with rectangular waveguide inputs leading a circular waveguide output, defining properly spaced and properly chosen waveguide steps having incremental height changes. The reflections from the walls of the reduced height waveguides are matched by a matching post coupled to a "Marie" mode transducer. The present invention provides a low-loss, compact radial power divider/combiner for use in high-frequency SSPAs that offers an unparalleled size, weight, and power combination, thereby offering a replacement for tube-based flight and ground amplifiers used in earth-orbiting defense missions and radar applications, as well as satellite secure communications systems requiring large bandwidths (secure satellite uplinks, downlinks, and cross-links), etc.

SUMMARY OF THE INVENTION

It is, therefore, an object of the present invention to provide a radial power divider/combiner for dividing/combining large number of amplifier signals within a wide bandwidth using reduced height waveguides inside a radial base.

It is a more specific object to provide a low-loss, compact radial power divider/combiner for use in wideband high-frequency (15% bandwidth in the 30-36 GHz range) Solid State Power Amplifier (SSPA) applications that offers an unparalleled size, weight, and power combination.

It is another object to provide a radial power divider/combiner that facilitates replacement of tube-based flight and ground amplifiers with solid state MMIC-based amplifiers for use in earth-orbiting defense missions and radar applications, as well as satellite secure communications systems requiring large bandwidths (secure satellite uplinks, downlinks, and cross-links), etc.

According to the present invention, the above-described and other objects are accomplished by providing a novel radial power combiner/divider with a higher order of power combining/dividing within a wide high-frequency bandwidth. The radial power combiner/divider generally comprises an axially-oriented mode transducer coupled to a radial base. The unique mode transducer transduces circular TE01 waveguide into rectangular TE10 waveguide, and the unique radial base combines/divides a plurality of ports into/from the single circular TE01 waveguide end of the transducer. The radial base incorporates full-height waveguides at the plurality of ports that are stepped down to reduced-height waveguides using stepped impedance transformers. This presents a stepped-impedance configuration that allows for reduced height waveguides inside the radial base (the height of the waveguides otherwise limiting the order N of combining), and hence a higher order combiner/divider. The reduced-height waveguides in the base converge radially to a matching post at the bottom center of the radial base which matches the reduced height rectangular waveguides into the circular waveguide that feeds the mode transducer. The matching post allows for a better output match at the circular waveguide of the radial base, which in turn with the mode transducer allows for a good output match of the divider/combiner as a whole.

The combiner/divider is herein illustrated in detail in the context of an N=24 combiner for use in Ka-band over the band of 31-36 GHz, with an input match <−20 dB under equal excitation of all input ports, an output match <−24 dB coming out of the mode transducer, and an insertion loss <0.6 dB. Of course, those skilled in the art will understand that certain exemplary specifications described herein in regard to the preferred embodiment are not limiting, and that the invention may be modified for other frequency ranges (other than 30-36 GHz), to power combine a different number of amplifiers (other than N=24), and that standard waveguide notations such as WR sizes and the like are for illustrative purposes only with regard to the illustrated embodiment.

While for the purposes of this description the innovation has been described as a power combiner, it also functions as a power divider.

DETAILED DESCRIPTION OF THE PREFERRED EMBODIMENT

The present invention is a radial power divider and/or combiner for dividing/combining a increased number N of amplifier signals within a wide bandwidth using compact radial format. The radial power combiner/divider generally comprises an axially-oriented mode transducer coupled to a radial base. The mode transducer transduces circular TE01 waveguide into rectangular TE10 waveguide, and the radial base combines/divides a plurality of ports into/from the single circular TE01 waveguide end of the transducer. The radial base is formed with a plurality of internal waveguides leading from peripheral output ports and converging radially to the center, the internal waveguides incorporating a stepped impedance configuration that allows a reduction in their size and increase in the order N of combining. The base also includes a matching post at the bottom center which matches the reduced height rectangular waveguides into the circular waveguide that feeds the mode transducer.

The invention may be implemented as a power combiner or power divider, or may be combined in a power divider/combiner.

The combiner/divider is herein illustrated in detail in the context of an N=24 combiner for use in Ka-band over the band of 31-36 GHz, with an input match <−20 dB under equal excitation of all input ports, an output match <−24 dB coming out of the mode transducer, and an insertion loss <0.6 dB.

Figure 1:
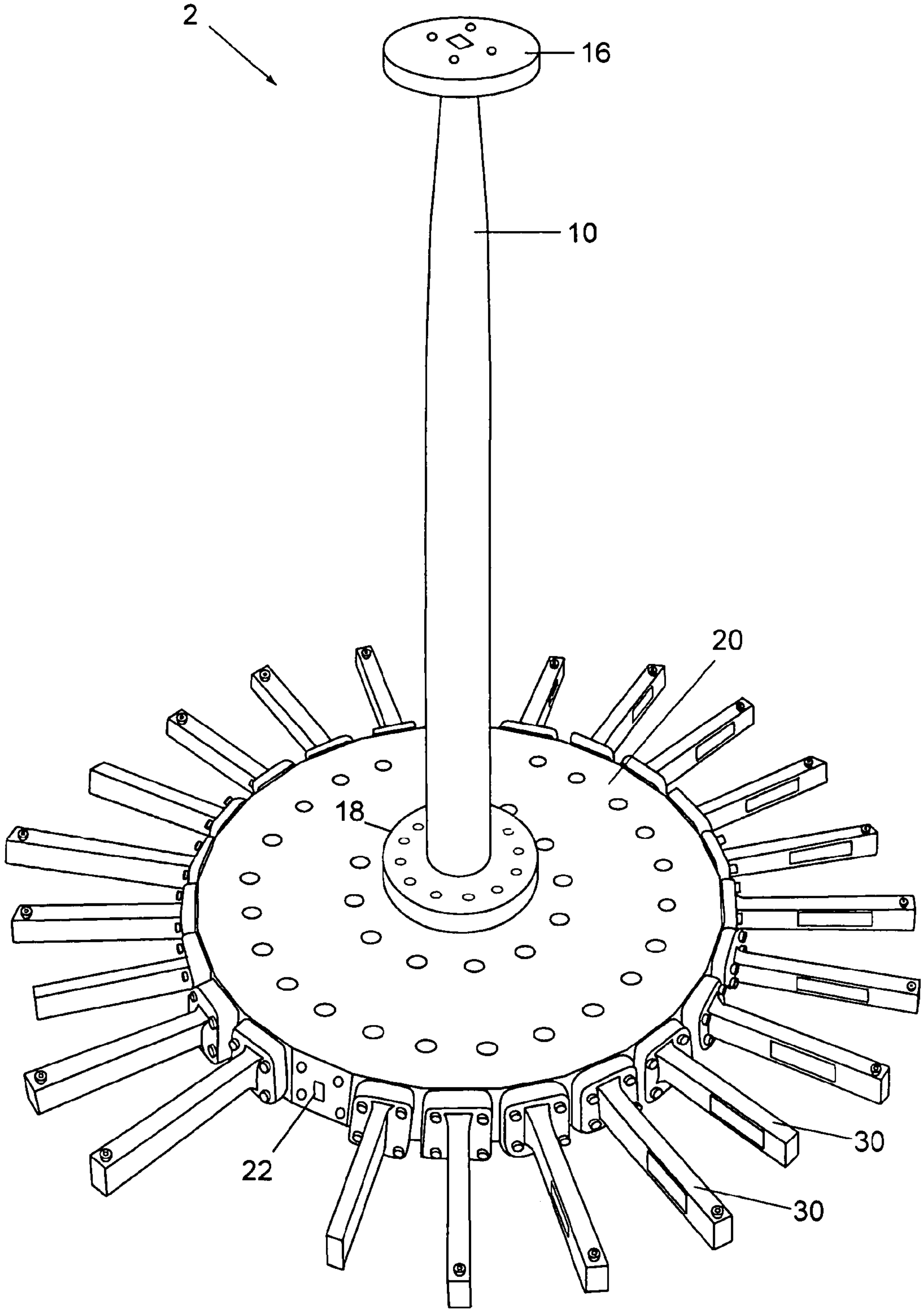
FIG. 1 is a perspective view of an exemplary N-way power divider/combiner 2 according to one embodiment of the present invention (where N=24) capable of providing a wide 15% bandwidth in a high-frequency (31 to 36 GHz). range.

FIG. 1 is a perspective view of an N-way power divider/combiner 2 according to a preferred embodiment of the present invention which, in this particular example, is tuned for N=24 ports and a 15% 31 to 36 GHz bandwidth.

The power divider/combiner 2 generally comprises a radial base 20 with a plurality N of internal waveguides (here N=24) running axially and internal to the base 20 from peripheral ports 22 (spaced evenly around the base 20) and converging to a matching post (obscured) in the center of base 20. For testing purposes, a plurality of matching loads 30 are shown mounted axially around the base 20 to balance the ports 22 not in use, and each load 30 is coupled to a non-use port 22 by machine-screw attachment to the periphery of the base 20. The base 20 has a topside center output port (obscured) for mounting a mode transducer 10. The mode transducer 10 is a three-section transducer with distal ports 16, 18 that convert the TE01 circular waveguide mode at the center output port of base 20 back into standard rectangular TE01 waveguide mode at transducer port 16.

Figure 2:
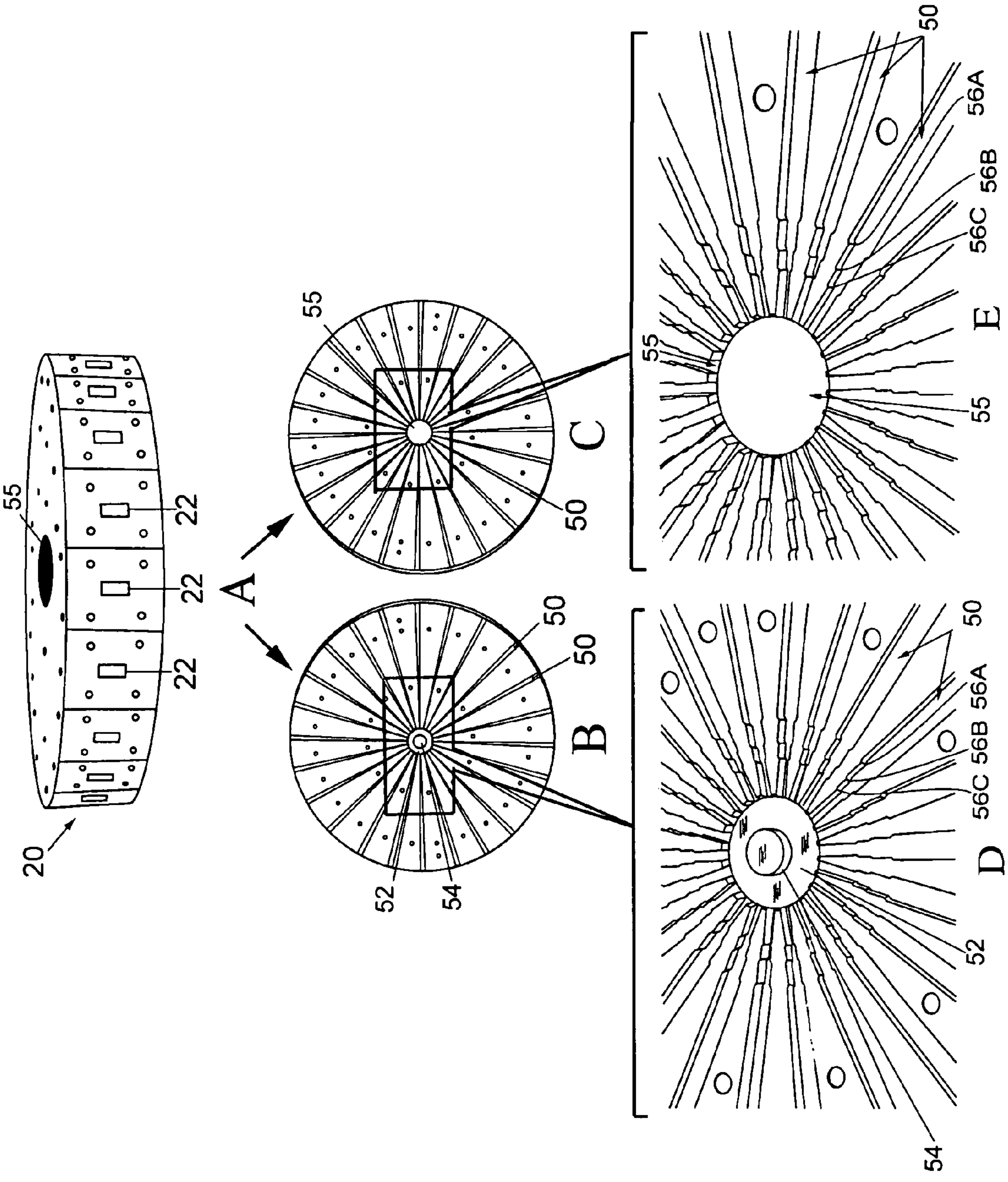
FIG. 2 is a composite drawing illustrating the radial base 20(A) of FIG. 1, sectioned along its width at (B) and (C), with exploded illustrations at (D) & (E) showing the sectioned internal waveguides 50.

FIG. 2 is a composite drawing illustrating the radial base 20(A), sectioned along its width at (B) and (C), with exploded illustrations at (D) & (E) showing the sectioned internal waveguides 50. The radial base 20(A) is preferably formed in the two sections as shown at (B) & (C) which are secured together by machine screws. The two sections of radial base 20 may be formed from Aluminum, Invar, Copper or other suitable waveguide material. The waveguides 50 are formed partially in the first section (B) of the base 20 and partially in the second section (C) and join when the sections (B) & (C) are joined to form full waveguides leading axially outward to ports 22. The illustrated ports 22 are formed as standard size WR28 rectangular TE01 waveguide ports, though other port sizes may suffice.

As best seen at exploded illustrations (D) & (E) the sectioned internal waveguides 50 of the first section (D) are evenly spaced and radially converge toward a central cylindrical cavity 52 that is formed with a central cylindrical matching post 54 at the center. The matching post 54 protrudes upward to a plateau even with the inner surface of the first section. The sectioned internal waveguides 50 of the second section (E) likewise converge to the topside center output port which is formed as a central cylindrical aperture 55 that conforms to the cavity 52. In accordance with the present invention, each axial waveguide 50 (along both sections) is formed with a rectangular cross-section that extends uniformly from ports 22 to one or more constricted steps 56 (three successive steps 56A-C being here illustrated), the steps 56 effectively forming a rectangular stepped-impedance configuration with incremental height changes.

Figure 3:
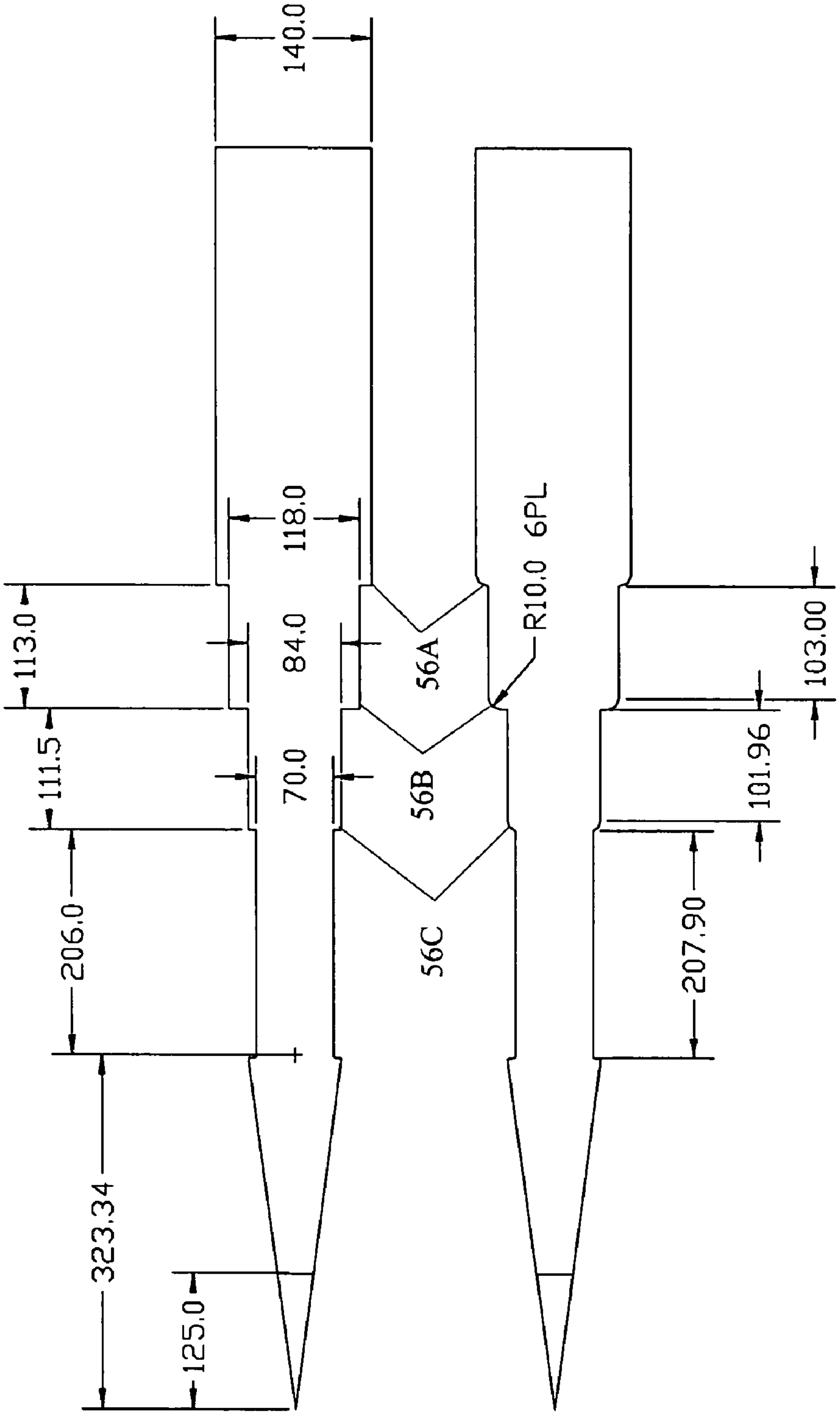
FIG. 3 is a composite diagram showing identical cross-sections (from above) of an axial waveguide 50 with an exemplary set of dimensions (mils, or 1/1000 inch) indicated thereon suited for attaining the performance specifications of the illustrated embodiment.

FIG. 3 is a composite diagram showing identical cross-sections (from above) of an axial waveguide 50 with an exemplary set of dimensions indicated thereon suited for attaining the performance specifications of the illustrated embodiment (bandwidth 30-36 GHz, N=24 amplifiers). All dimensions are shown in mils (1/1000 inches). The waveguide 50 begins at 140 mils width to the first step 56A which is constricted by a difference of 22 mils, then continues 113 mils along at 118 mils wide to the second step 56B which is constricted by a difference of 34 mils, then continues 111.5 mils along at 70 mils wide to the third step 56C which is constricted by a difference of 14 mils. Each step 56A-C is rounded with a 10 mil radius.

In general operation when used as a combiner, rectangular TE01 waveguide signals input to ports 22 form reflections along the walls of the stepped-height waveguides 50 which must be combined properly into a TE01 circular waveguide mode, and this purpose is served by the matching post 54, which provides a circular waveguide output through the topside center output port (aperture 55) into the mode transducer 10 described below. Thus, the radial base 20 has standard rectangular TE10 mode waveguide input and a circular waveguide TE01 mode output at aperture 55.

Figure 4:
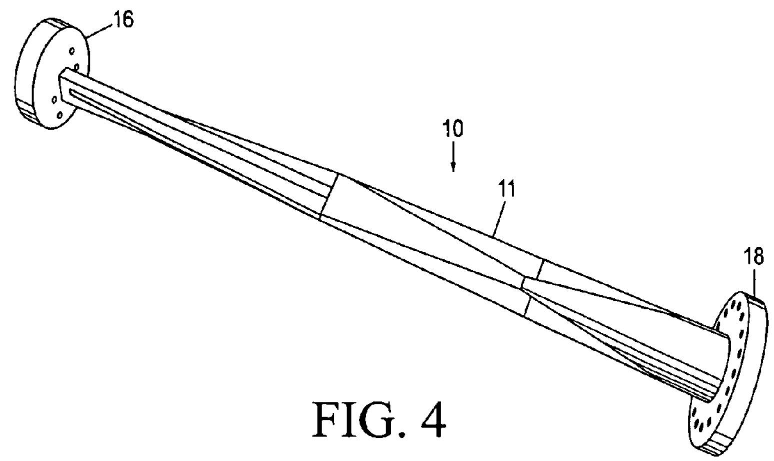
FIG. 4 is a perspective view of the "Marie" mode transducer 10 of FIG. 1 with circular waveguide (CWG) port 18 including a distally attached coupling flange at one end of the transducer body 11 and rectangular waveguide port 16 (either WR28 or WR4) at the other end also including a coupling flange.

FIG. 4 is a perspective view of the "Marie" mode transducer 10 of FIG. 1 with circular waveguide (CWG) port 18 including a distally attached coupling flange at one end of the transducer body 11 and rectangular waveguide port 16 (either WR28 or WR24) at the other end also including a coupling flange. The illustrated circular waveguide port 18 is a standard circular (CWG) port or the like, for example, input size WR28 (circular waveguides are not called out in standards like rectangular waveguides and so the designation "circular waveguide (CWG)" is herein used. In the preferred embodiment a circular waveguide was chosen to support the desired circular TE01 mode over the band of interest, and the size is sufficient to combine the 24 inputs/outputs.

Figure 5:
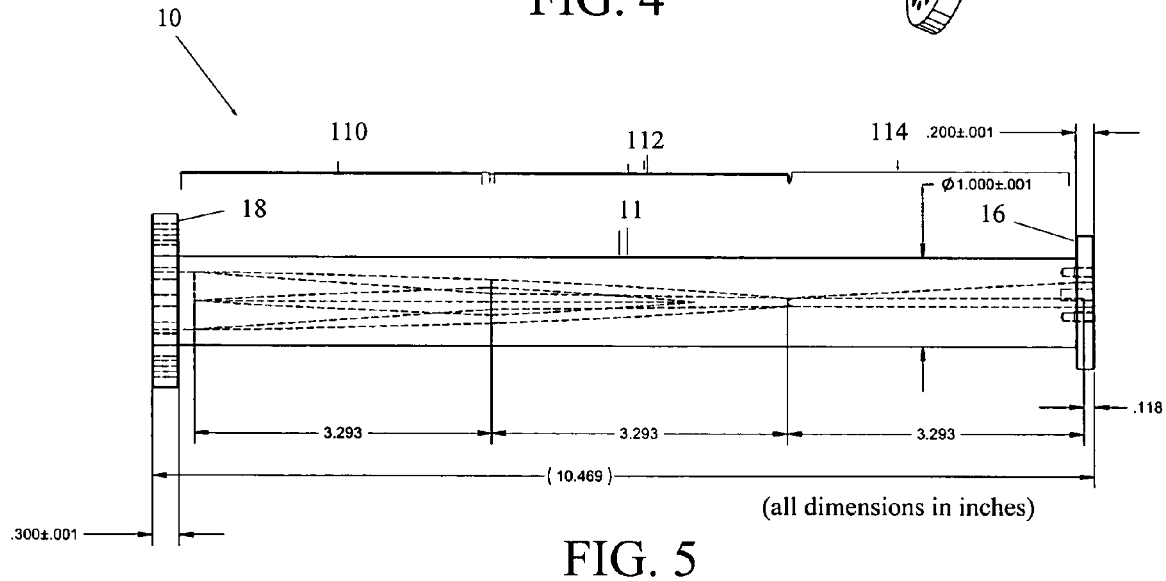
FIG. 5 is a cross-section of the mode transducer body 11 of FIG. 4.

A cross-section of the mode transducer body 11 is show at FIG. 5 with exemplary dimensions (in inches). The flange of port 18 is secured to transducer body 11 as shown and is attached directly to the base 20 (via machine screws) for coupling the transducer body 11 thereto to aperture 55 in communication with the cavity 52 (and matching post 54) of base 20.

Figure 6:
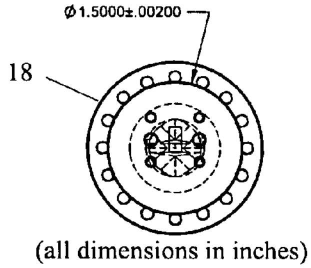
FIG. 6 is a front view of circular waveguide port 18 with flange.
Figure 7:
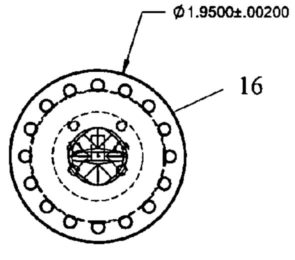
FIG. 7 is a front view of rectangular waveguide port 16 (either WR28 or WR24) with flange.

FIG. 6 is a front view of port 18 with flange, and FIG. 7 is a front view of port 16 with flange. As stated above, in the preferred (illustrated) embodiment port 18 may be a standard circular CWG input size WR28 waveguide port, though other standard port sizes are possible. Port 16 may be either of a WR28 or WR34 rectangular output, though again other standard port sizes are possible.

The transducer body 11 of the mode transducer 10 is designed to convert the radial base 20 circular TE01 waveguide output at aperture 55 back to rectangular TE10 waveguide mode. Generally, the transducer body 11 of the mode transducer 10 was designed based on the concept of S. S. Saad, J. B. Davies, and O. J. Davies, "Analysis and Design of a Circular TE01 Mode Transducer," Microwave, Optics and Acoustics, vol. 1, pp. 58-62, Jan. 1977. Saad et al. therein disclose the concept of a "Marie Mode" transducer for transducing multiple rectangular TE10 modes to circular TE01 mode. Multiple TE01 modes are transitioned into an intermediate mode, which is transitioned into a circular TE01 mode and vice versa. The present transducer employs different symmetry considerations and dimensions.

As seen in FIG. 5, the transducer body 11 includes three distinct sections beginning at the TE01 end (left) with a tapered cylindrical waveguide section 110 running approximately one-third the length of transducer body 10 and tapering inward to transition the multiple TE01 modes from base 20 into an intermediate cylindrical mode. Next, an outwardly-tapered rectangular waveguide section 112 running approximately one-third the length of transducer body 10 and tapering outward to transition the intermediate cylindrical mode to an intermediate rectangular mode. Finally, a pyramidal section 114 running the last third the length of transducer body 10 to transition the intermediate rectangular mode to a rectangular TE01 mode.

The exact profile, contour and length of each section 110-114 must be precisely tuned in order to make it possible to combine 24 inputs, operating from 31 to 36 GHz. Consequently, FIGS. 8-10 are each composite drawings illustrating the particular profile, contour and length of each of section 110-114, respectively.

Figure 8:
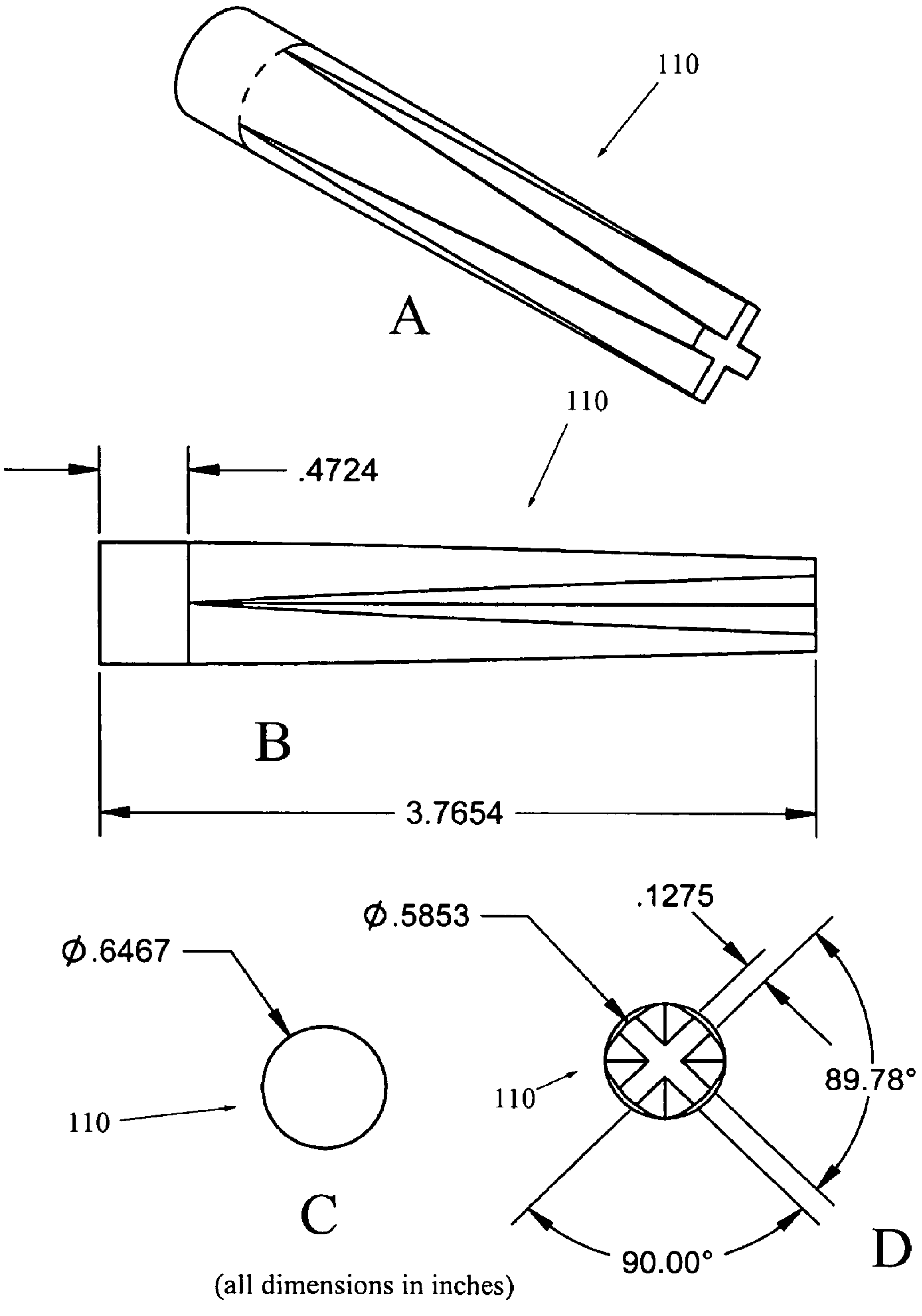
FIG. 8 is a composite illustration showing the tapered cylindrical waveguide section 110 of the mode transducer body 11 of FIG. 4, including a perspective view (A), and a side view (B) with dimensions (in inches), left end view (C) and right end view (D).

Beginning at the TE01 end, FIG. 8 shows the tapered cylindrical waveguide section 110, including a perspective view (A), and a side view (B) with dimensions (in inches), left end view (C) and right end view (D). The cylindrical waveguide section 110 begins at the left with a full cylindrical cross-section of constant radius, as seen at (C), running 0.4724 inches, then beginning a gradual taper to a cross-shaped section at right and as seen at (D). The dimensions (inches) and angular disposition of the cross-shaped section are indicated in FIG. 8(D). The cylindrical waveguide section 110 tapers inward to transition the multiple TE01 modes from base 20 into an intermediate cylindrical mode.

Figure 9:
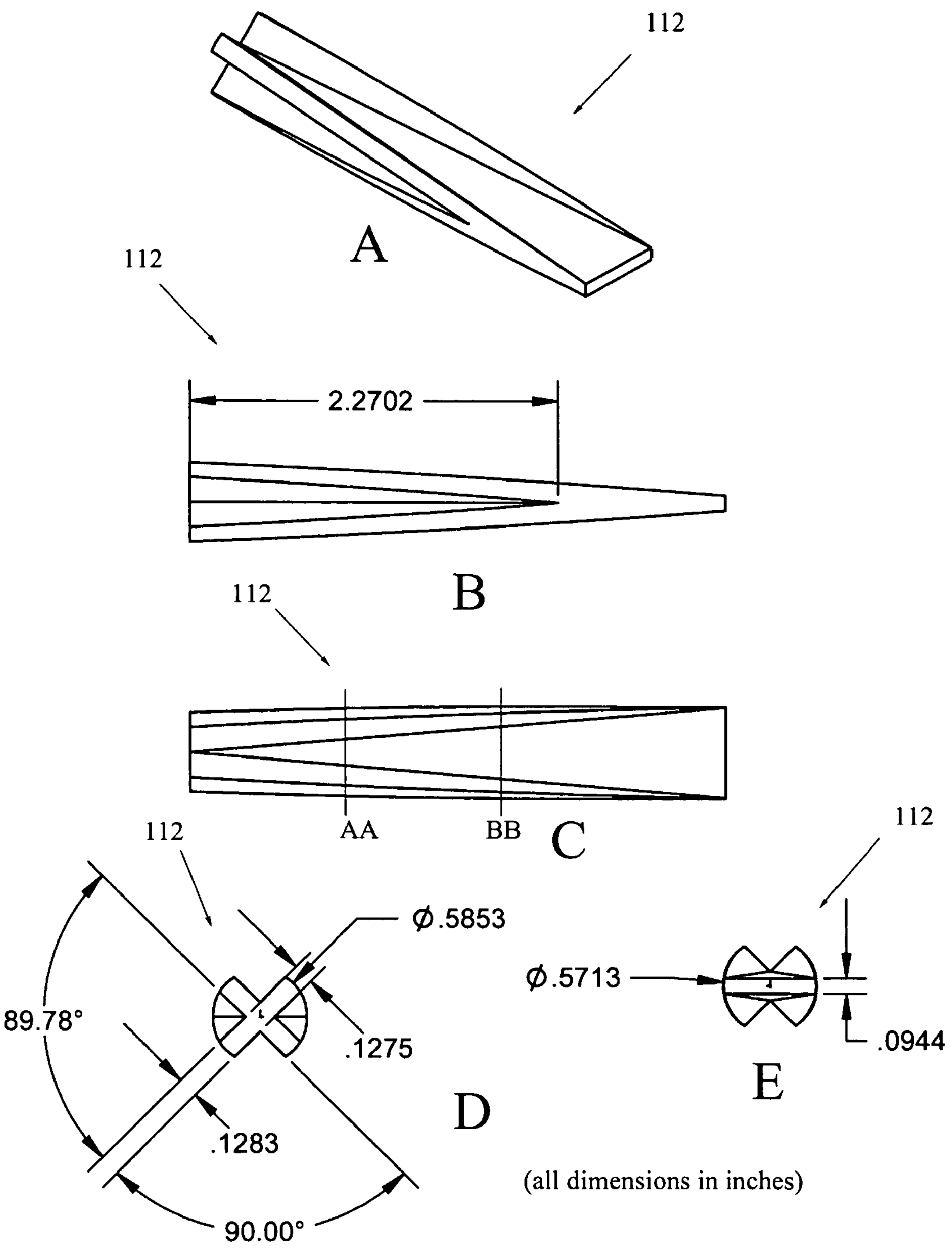
FIG. 9 is a composite illustration showing the outwardly-tapered rectangular waveguide section 112, including a perspective view (A), a side view (B) with dimensions (inches), top view (C), and two different cross-sections including section (D) taken along line AA of FIG. 9(C), and section (E) taken along line BB of FIG. 9(C).
Figure 10:
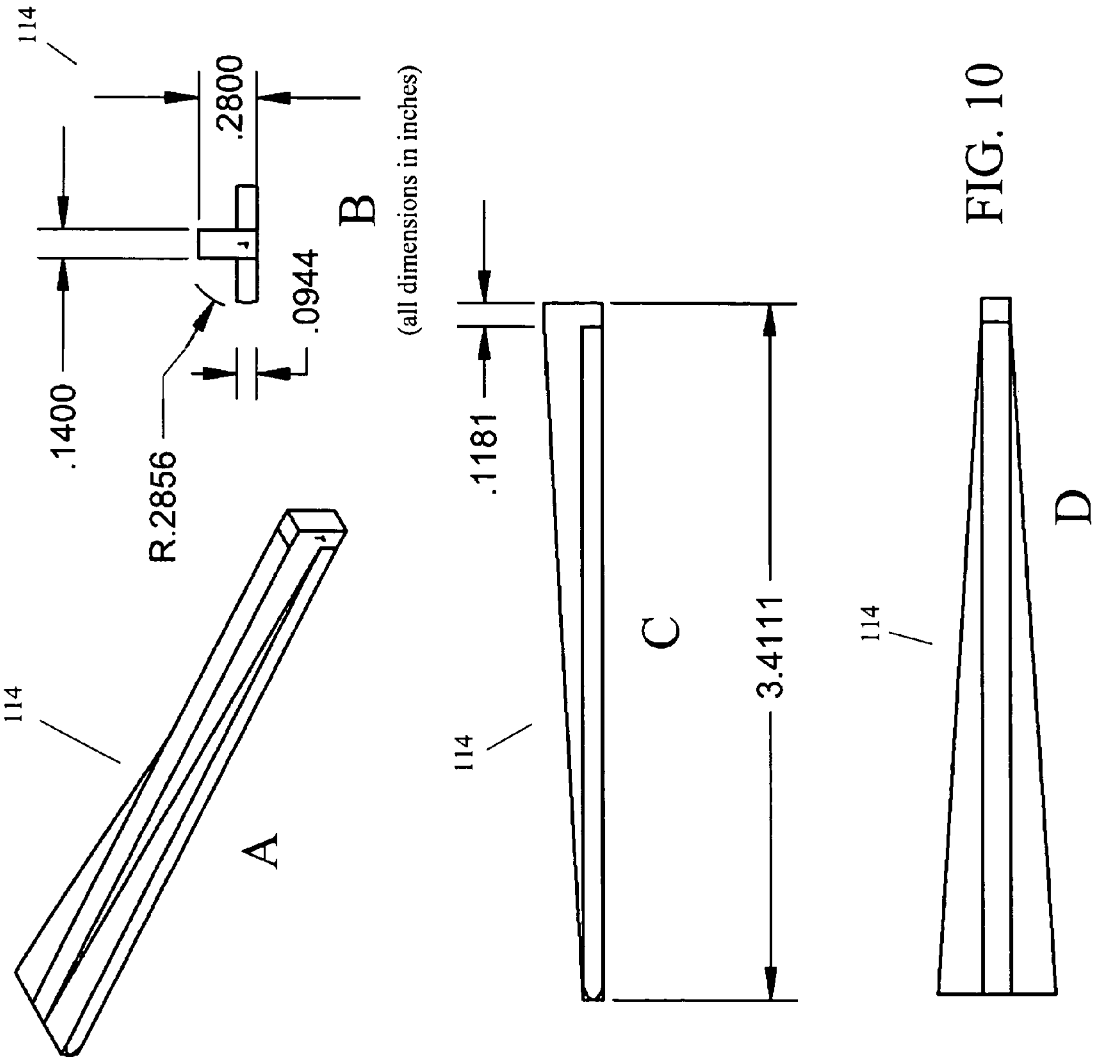
FIG. 10 is a composite illustration showing the pyramidal section 114 from various perspectives, including a perspective view (A), a right-end view (B) with both linear and angular dimensions (inches), side view (C), and top view (D).

The cylindrical waveguide section 110 merges into an outwardly-tapered rectangular waveguide section 112 shown in FIG. 9, which likewise runs approximately one-third the length of transducer body 10 and tapers from the cross-shaped section of FIG. 8(D) to a flat waveguide section.

FIG. 9 shows the outwardly-tapered rectangular waveguide section 112, including a perspective view (A), a side view (B) with dimensions (inches), top view (C), and two different cross-sections including section (D) taken along line AA of FIG. 9(C), and section (E) taken along line BB of FIG. 9(C). The outwardly-tapered rectangular waveguide section 112 begins at the left with the cross-shaped section conforming to that of FIG. 8(D), the arms of the cross tapering away and graduating to the flat waveguide section at right, thereby converting the intermediate cylindrical mode to an intermediate rectangular mode.

Finally, FIG. 10 illustrates the pyramidal section 114 that runs the last third of transducer body 10 to transition the intermediate rectangular mode to a fully rectangular TE01 mode. FIG. 10 shows the pyramidal section 114 from various perspectives, including a perspective view (A), a right-end view (B) with both linear and angular dimensions (inches), side view (C), and top view (D). The pyramidal section 114 begins at left conforming to the flat horizontal rectangular waveguide section 112 at the right of FIG. 9(A), and graduating to a flat orthogonal waveguide section at the right of FIG. 10(A), thereby converting the intermediate rectangular mode to a fully rectangular TE01 mode at output port 16 of FIGS. 5 and 7.

The three above-described sections 110, 112, and 114 are preferably integrally formed in a unitary transducer body 11, which is then attached to ports 16, 18.

It is noteworthy that the above-described transducer 10 can easily be designed to provide two different rectangular waveguide outputs by modification of only section 114, leading to an alternate design for multiple frequency ranges with a common circular waveguide input.

For operation of the power divider/combiner 2 as a divider. In this case a signal generator will provide an input signal to the divider 2 at the input flange 16 of mode transducer 20 via a coaxial cable attached to the flange 16 via a connector, which may be an SMA connector, for example. Once inside the mode transducer 20, the signal propagates down through the transducer body 11 through the a pyramidal section 114 which transitions from rectangular TE01 mode to intermediate rectangular mode, then through tapered rectangular waveguide section 112 which transitions the intermediate rectangular mode to an intermediate cylindrical mode, and finally through the tapered cylindrical waveguide section 110 which transitions the intermediate rectangular mode to a single cylindrical TE10 modes which is propagated into base 20. The matching post 54 provides a circular waveguide output from the transducer 10 into a rectangular mode within each axial waveguide 50 in the base 20. The waveguides 50 maintain a rectangular cross-section to the constricted steps 56 which impart a rectangular stepped-impedance configuration as a result of their incremental height changes. Thus, inside the base 20 the signals are effectively divided to form N output signals (here N=24). One or more of these output signals may then be provided to a signal receiver coupled to ports 22. The signal receiver may be a test device, such as a spectrum analyzer, or a multiple-amplifier module.

By reversing signal direction, the divider/combiner may function as a combiner. In this case, a plurality N of TE01 waveguide signals are input at ports 22 (via coaxial cables or the like) and propagate in through the waveguides 50, which maintain a rectangular cross-section to the constricted steps 56. The steps 56 impart a rectangular stepped-impedance configuration as a result of their incremental height changes. The N signals are combined and transitioned by matching post 54 from rectangular TE01 mode to circular TE10 mode, and the combined signal is output through port 18 into the mode transducer body 11. Inside the transducer body the signal propagates through the tapered cylindrical waveguide section 110, then through tapered rectangular waveguide section 112, and finally through the rectangular waveguide section 114 which transitions the intermediate rectangular mode to a single rectangular TE01 mode which is output through port 16. A prototype N=24 combiner has been constructed for Ka-band and demonstrated over the band of 31-36 GHz with an input match <−20 dB under equal excitation of all ports 22, output match <−24 dB at the port in flange 16 of the mode transducer 10, and an insertion loss <0.6 dB. The functional bandwidth of the combiner/divider 2 exceeds the initial design goal of 31-36 GHz.

Generally, for normal operation all ports 22 will be used. However, for testing purposes only one or two ports 22 will be used, and a plurality of matching loads 30 are shown mounted axially around the base 20 (FIG. 1) to balance the ports 22 not in use. The divider/combiner 2 may be tested using a conventional vector network analyzer (VNA) consisting of a sweep oscillator, a test set which includes two ports, a control panel, an information display, and coaxial cables to attach to the divider/combiner 2.

Figure 11:
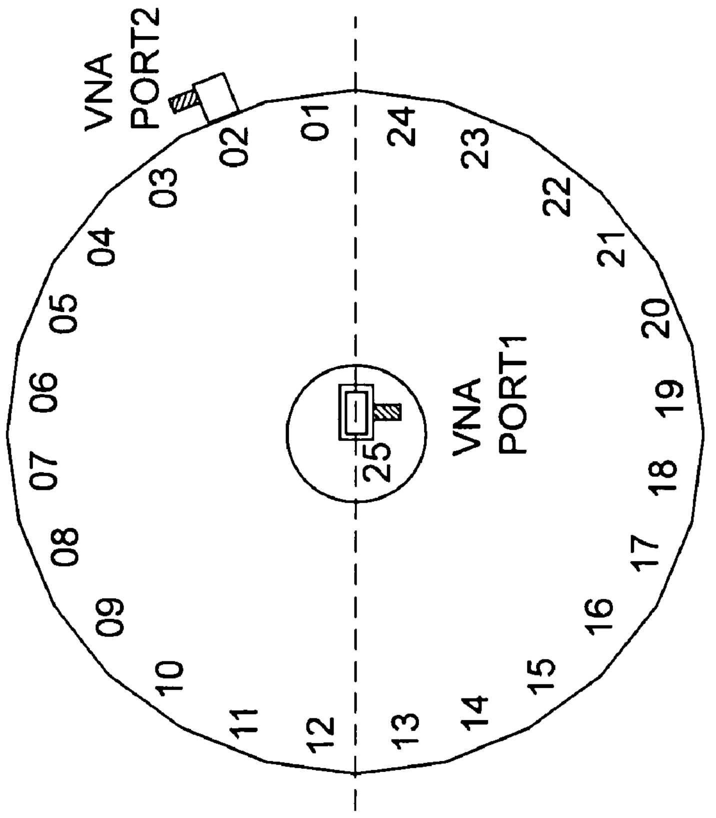
FIGS. 11 and 12 illustrate the requisite test connections for "Output Match" and "Insertion Loss" measurements.
Figure 12:
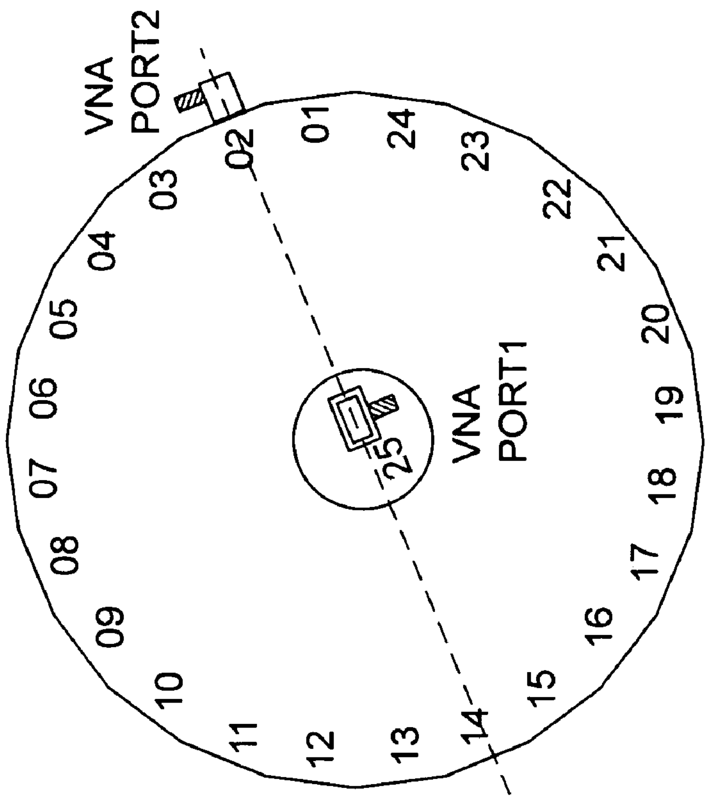
Figure 13:
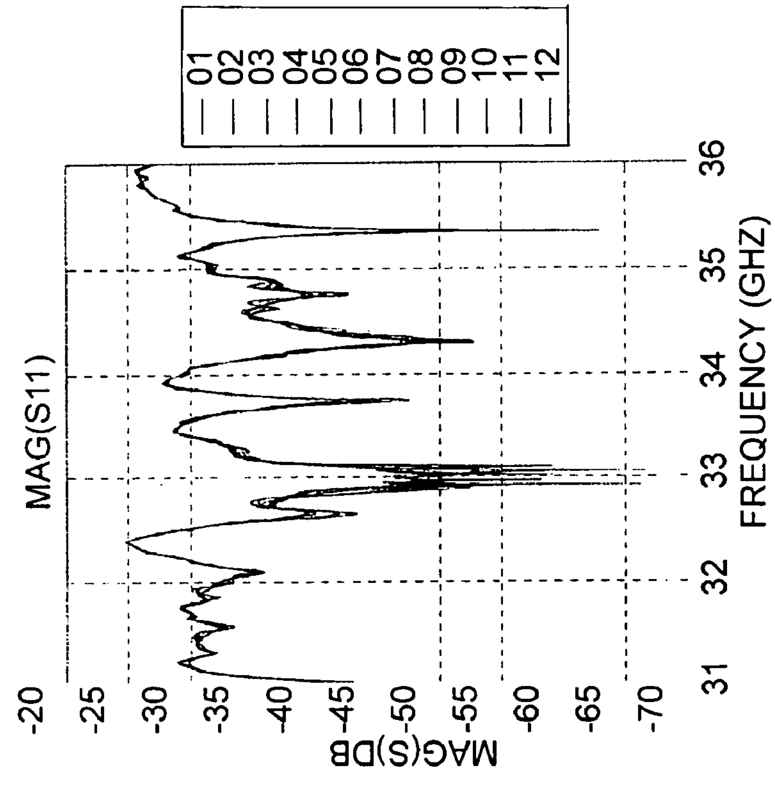
FIGS. 13 and 14 are graphs of the port matching results.
Figure 14:
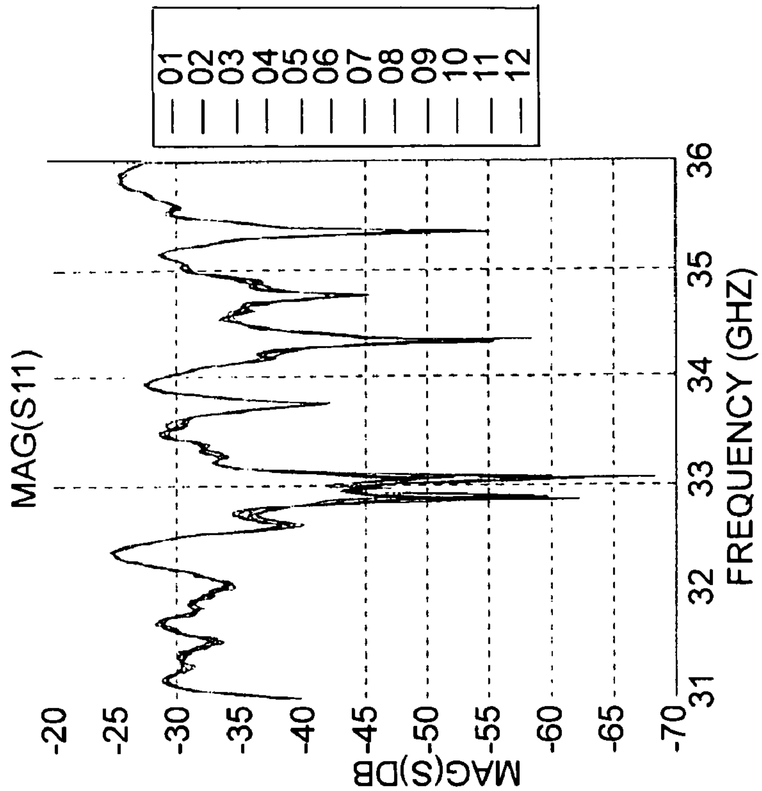

FIGS. 11 and 12 illustrate the requisite test connections for “Output Match” and “InsertionLoss” measurements, and FIGS. 13 and 14, respectively show the port matching results on the rectangular waveguide ports 01-12.

In FIG. 11, measurements were competed with the VNA port1 fixed on port 25 of the divider/combiner 20, VNA port2 on ports 01 through 12, the transducer at S/N 2, and Base S/N 2.

FIG. 13 illustrates the port match over the intended bandwidth 31-36 GHz, which shows the match <−24 dB over the bandwidth.

In FIG. 12, measurements were completed with the VNA port1 fixed on port 25 of the divider/combiner 20, VNA port2 on ports 01 through 14 (keeping orientation same as above), the Transducer at S/N 2, and Base at S/N 2.

FIG. 14 illustrates the port match over the intended bandwidth 31-36 GHz, which shows similarly good behavior. The mode transducer insertion loss is calculated by measuring the two transducers SN1 and SN2 back-to-back, and dividing the loss by half. The agreement with theory from the design is excellent. For the Mode transducer with the WR34 output port there is a good match <−27 dB, and low measured insertion loss. The input match of each of the other input ports 2 through ports 24 were likewise measured, and the measurements indicate the level of repeatability and error to be expected. This combiner has an input match <−20 dB under equal excitation of all input ports, an output match <−24 dB at the RWG port of the Marie Transducer, and an insertion loss <0.6 dB. The functional bandwidth of the combiner exceeds the initial design band of 31-36 GHz. This excellent performance demonstrates the potential for this power combiner 2 to enable a new class of high-power, high-efficiency solid-state amplifiers. It should now be apparent that the above-described radial power divider/combiner is capable of replacing tube-based flight and ground amplifiers with solid state MMIC-based amplifiers for use in earth-orbiting defense missions and radar applications, as well as satellite secure communications systems requiring large bandwidths (secure satellite uplinks, downlinks, and cross-links), etc.

Having now fully set forth the preferred embodiment and certain modifications of the concept underlying the present invention, various other embodiments as well as certain variations and modifications of the embodiments herein shown and described will obviously occur to those skilled in the art upon becoming familiar with said underlying concept. It is to be understood, therefore, that the invention may be practiced otherwise than as specifically set forth herein.

We claim:

1. A radial power divider/combiner comprising: a radial base including a plurality of internal rectangular waveguides each converging radially from a periphery of said base to a central cavity, the internal rectangular waveguides formed with a stepped-height configuration comprising a plurality of spaced constrictions for creating a stepped impedance, a matching post formed as a truncated cylinder at a center of said central cavity, and a port formed as an aperture in said base opening to the central cavity; and a mode transducer mounted axially on said base and having a circular waveguide port at one end coupled to the aperture of said base and a rectangular waveguide port at another end.

2. The radial power divider/combiner of claim 1, wherein the plurality of spaced constrictions further comprises at least two constrictions.

3. The radial power divider/combiner of claim 1, wherein said mode transducer further comprises a circular CWG input port of standard size coupled to the aperture of said base.

4. The radial power divider/combiner of claim 1, wherein said mode transducer further comprises any one of a standard rectangular WR28 or WR34 port at said other end.

5. The radial power divider/combiner of claim 1, wherein said mode transducer further comprises a transducer body including three distinct sections.

6. The radial power divider/combiner of claim 5, wherein said three distinct sections include a tapered cylindrical waveguide section running approximately one-third a length of the transducer body, an outwardly-tapered rectangular waveguide section running approximately one-third the length of transducer body, and a pyramidal section running approximately one third the length of said transducer body.

7. A radial power divider/combiner comprising: a radial base including a plurality of internal rectangular waveguides each converging radially from a periphery of said base to a central cavity, the internal rectangular waveguides formed with a stepped-height configuration comprising a plurality of spaced constrictions for creating a stepped impedance, and a port formed as an aperture in said base opening to the central cavity; and a mode transducer mounted axially on said base and having a circular waveguide port at one end coupled to the aperture of said base and a rectangular waveguide port at another end.

8. The radial power divider/combiner of claim 7, wherein said radial base further comprises a matching post formed as a truncated cylinder at a center of said central cavity.

9. The radial power divider/combiner of claim 7, wherein the plurality of spaced constrictions further comprises at least two constrictions.

10. The radial power divider/combiner of claim 7, wherein said mode transducer further comprises a circular CWG input port of standard size coupled to the aperture of said base.

11. The radial power divider/combiner of claim 7, wherein said mode transducer further comprises any one of a standard rectangular WR28 or WR34 port at said other end.

12. The radial power divider/combiner of claim 7, wherein said mode transducer further comprises a transducer body including three distinct sections.

13. The radial power divider/combiner of claim 12, wherein said three distinct sections include a tapered cylindrical waveguide section running approximately one-third a length of the transducer body, an outwardly-tapered rectangular waveguide section running approximately one-third the length of transducer body, and a pyramidal section running approximately one third the length of said transducer body.

* * * * *